(12) United States Patent
Hsu et al.

(10) Patent No.: US 12,219,693 B2
(45) Date of Patent: Feb. 4, 2025

(54) CARRIER STRUCTURE

(71) Applicant: SILICONWARE PRECISION INDUSTRIES CO., LTD., Taichung (TW)

(72) Inventors: Chin-Wei Hsu, Taichung (TW); Jui-Kun Wang, Taichung (TW); Shu-Yu Ko, Taichung (TW); Fang-Wei Chang, Taichung (TW); Hsiu-Fang Chien, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 217 days.

(21) Appl. No.: 17/979,262

(22) Filed: Nov. 2, 2022

(65) Prior Publication Data
US 2024/0049382 A1 Feb. 8, 2024

(30) Foreign Application Priority Data

Aug. 4, 2022 (TW) .................................. 111129375

(51) Int. Cl.
*H05K 1/02* (2006.01)
*H01L 23/544* (2006.01)
*H05K 3/00* (2006.01)

(52) U.S. Cl.
CPC ......... *H05K 1/0266* (2013.01); *H01L 23/544* (2013.01); *H05K 3/0008* (2013.01); *H01L 2223/54426* (2013.01); *H01L 2223/54453* (2013.01); *H05K 2203/166* (2013.01); *H05K 2203/167* (2013.01)

(58) Field of Classification Search
None
See application file for complete search history.

(56) References Cited

U.S. PATENT DOCUMENTS

| | | | | |
|---|---|---|---|---|
| 5,637,835 A | * | 6/1997 | Matern | H05K 1/0293 174/266 |
| 5,691,242 A | * | 11/1997 | Nomi | H01L 23/3121 257/E23.125 |
| 6,150,614 A | * | 11/2000 | Miller | H05K 1/118 174/254 |
| 6,246,015 B1 | * | 6/2001 | Kim | H01L 21/565 174/255 |
| 6,268,568 B1 | * | 7/2001 | Kim | H05K 3/3436 174/250 |

(Continued)

FOREIGN PATENT DOCUMENTS

| | | | | |
|---|---|---|---|---|
| CN | 102986307 A | * | 3/2013 | ............. H05K 1/024 |
| CN | 105874590 A | * | 8/2016 | ............. H01L 21/52 |

(Continued)

*Primary Examiner* — Binh B Tran
*Assistant Examiner* — Muhammed Azam
(74) *Attorney, Agent, or Firm* — Dority & Manning, P.A.

(57) ABSTRACT

A carrying structure is defined with a main area and a peripheral area adjacent to the main area, where a plurality of packaging substrates are disposed in the main area in an array manner, a plurality of positioning holes are disposed in the peripheral area, and a plurality of positioning traces are formed along a part of the edges of the plurality of positioning holes, such that the plurality of positioning traces are formed with notches.

11 Claims, 4 Drawing Sheets

(56) References Cited

U.S. PATENT DOCUMENTS

| | | | |
|---|---|---|---|
| 6,324,754 B1 * | 12/2001 | DiStefano | H05K 1/111 |
| | | | 361/764 |
| 6,428,641 B1 * | 8/2002 | Yoon | H01L 24/94 |
| | | | 257/E23.179 |
| 6,531,762 B1 * | 3/2003 | Liao | H01L 23/49838 |
| | | | 257/784 |
| 6,573,610 B1 * | 6/2003 | Tsai | H01L 24/81 |
| | | | 257/E21.511 |
| 6,615,448 B2 * | 9/2003 | Melara | B60B 33/0068 |
| | | | 16/35 R |
| 6,646,349 B1 * | 11/2003 | Pu | H01L 23/50 |
| | | | 257/E23.079 |
| 6,812,803 B2 * | 11/2004 | Goergen | H05K 1/116 |
| | | | 333/236 |
| 6,879,494 B2 * | 4/2005 | Zu | H01L 23/49822 |
| | | | 361/720 |
| 7,079,399 B2 * | 7/2006 | Wang | H05K 1/116 |
| | | | 361/777 |
| 7,394,159 B2 * | 7/2008 | Goto | H05K 3/421 |
| | | | 257/737 |
| 7,419,897 B2 * | 9/2008 | Shih | H05K 3/243 |
| | | | 257/E23.07 |
| 7,553,166 B2 * | 6/2009 | Gobron | H05K 3/365 |
| | | | 439/287 |
| 9,177,893 B2 * | 11/2015 | Mauder | H01L 29/78 |
| 9,236,674 B2 * | 1/2016 | Rabinovitz | H01R 12/721 |
| 9,263,380 B2 * | 2/2016 | Tsai | H01L 23/49811 |
| 9,699,910 B2 * | 7/2017 | Tang | H05K 1/116 |
| 10,468,181 B1 * | 11/2019 | Vinciarelli | H05K 1/165 |
| 10,522,453 B2 * | 12/2019 | Lin | H01L 23/49811 |
| 10,785,871 B1 * | 9/2020 | Vinciarelli | H05K 1/116 |
| 10,849,212 B2 * | 11/2020 | Siu | H05K 1/026 |
| 10,863,626 B1 * | 12/2020 | Huang | H05K 1/0271 |
| 11,470,714 B2 * | 10/2022 | Feng | H05K 3/0035 |
| 2003/0070931 A1 * | 4/2003 | Kitchens | C25D 7/12 |
| | | | 205/125 |
| 2007/0243666 A1 * | 10/2007 | Huang | H01L 21/6835 |
| | | | 257/E23.114 |
| 2007/0278659 A1 * | 12/2007 | Chang | H01L 23/49811 |
| | | | 257/784 |
| 2016/0064316 A1 * | 3/2016 | Carpenter | H01L 23/49838 |
| | | | 438/126 |
| 2020/0128671 A1 * | 4/2020 | Xiang | H01F 27/2804 |
| 2022/0386460 A1 * | 12/2022 | Chang | H05K 1/181 |
| 2024/0049382 A1 * | 2/2024 | Hsu | H05K 1/0266 |

FOREIGN PATENT DOCUMENTS

| | | | | |
|---|---|---|---|---|
| CN | 106505059 A | * | 3/2017 | |
| CN | 110024115 A | * | 7/2019 | H01L 21/2855 |
| CN | 113260134 A | * | 8/2021 | H05K 1/0206 |
| DE | 69434160 T2 | * | 12/2005 | B23K 1/0008 |
| DE | 60314868 T2 | * | 3/2008 | H01L 23/49827 |
| DE | 102011084326 A1 | * | 4/2013 | F21V 17/12 |
| DE | 202019001963 U1 | * | 7/2019 | |
| EP | 0645276 B1 | * | 5/1998 | |
| JP | H1027861 A | * | 1/1998 | |
| JP | H10247656 A | * | 9/1998 | |
| JP | 5003359 B2 | * | 8/2012 | H05K 1/0251 |
| KR | 20010012575 A | * | 2/2001 | |
| TW | I234258 B | * | 6/2005 | |
| TW | 201032311 A | * | 9/2010 | H01L 23/3128 |
| TW | 202013640 A | * | 4/2020 | H01L 23/492 |
| TW | 202301577 A | * | 1/2023 | H01L 21/4857 |

* cited by examiner

CARRIER STRUCTURE

BACKGROUND

1. Technical Field

The present disclosure relates to a semiconductor packaging process, and more particularly, to a carrier structure that can improve process reliability.

2. Description of Related Art

In the early days of the development of semiconductor packaging, a lead frame was often used as a carrier for carrying active elements, the main reason was that the lead frame has advantages of lower manufacturing cost and higher reliability. However, with the flourishing development of the electronic industries, electronic products are trending toward light, thin and short in type, and are toward high-performance, high-function, and high-speed research and development in terms of function. Therefore, in order to meet the requirements of high integration and miniaturization of semiconductor devices, the lead frame is gradually replaced by a packaging substrate with high-density and fine-pitch circuits in the existing packaging process.

As shown in FIG. 1, in a conventional packaging process, a plurality of packaging substrates 10 are arranged in an array to form a substrate strip 1, wherein an isolation portion 11 is connected between each of the packaging substrates 10, and a removal portion 12 is formed on the periphery of the packaging substrate 10 and the isolation portion 11, and the removal portion 12 has a plurality of positioning holes 100 thereon.

However, the size of the positioning hole 100 on the conventional substrate strip 1 is extremely small, which is not beneficial for a positioning pin on a machine to align with the positioning hole 100, such that the positioning pin is easily damaged by colliding with the substrate strip 1.

Furthermore, although it is beneficial for the positioning pin to be inserted into the positioning hole 100 if the size of the positioning hole 100 is increased, the arrangement/layout area of the positioning hole 100 on the substrate strip 1, however, would also be increased, such that the layout of the positioning hole 100 would exceed the scope/range of the removal portion 12, thereby affecting the layout area of the packaging substrate 10. As a result, the number of the packaging substrates 10 must be reduced, resulting in poor layout utilization of the substrate strip 1 under the requirement of fixed volume specification.

Therefore, how to overcome the aforementioned drawbacks of the prior art has become an urgent issue to be addressed at present.

SUMMARY

In view of the various shortcomings of the prior art, the present disclosure provides a carrier structure being defined with a main area and a peripheral area adjacent to the main area, the carrier structure comprises: a plurality of packaging substrates disposed in the main area; a plurality of positioning holes disposed in the peripheral area; and a plurality of positioning traces disposed in the peripheral area and arranged along a part of edges of the plurality of positioning holes.

In the aforementioned carrier structure, the plurality of positioning traces are free from surrounding the entire edges of the plurality of positioning holes to form notches. For instance, the notch of the positioning trace is facing toward the main area.

In the aforementioned carrier structure, the positioning trace is arranged on the edge of the positioning hole away from a side of the main area.

In the aforementioned carrier structure, the positioning hole is circular, and the positioning trace surrounds a semicircular edge of the positioning hole and presents a semicircular arc.

In the aforementioned carrier structure, the positioning hole is circular, and the positioning trace surrounds a quarter of circular edge of the positioning hole and presents a quarter-circular arc.

In the aforementioned carrier structure, the positioning hole is circular, and the positioning trace surrounds most of the edge of the positioning hole and not arranged at the top of the arc of the positioning hole.

In the aforementioned carrier structure, the present disclosure further comprises an insulating protective layer covering the peripheral area and the main area, wherein the insulating protective layer is formed with at least one opening, and the positioning hole and the positioning trace are exposed from the opening. For instance, the shape of the opening is corresponding to the contour shape formed by the positioning hole and the positioning trace on the edge of the positioning hole. Alternatively, the shape of the opening is symmetrical or asymmetrical.

As can be understood from the above, in the carrier structure of the present disclosure, the positioning trace is arranged on the edge of the positioning hole to facilitate the positioning pin on the machine to align and insert into the tiny positioning hole. Therefore, compared with the prior art, the carrier structure of the present disclosure can prevent the positioning pin from colliding the surface of the carrier structure and can prevent the positioning pin from being damaged.

In addition, the positioning trace is designed with a notch, so the positioning trace does not need to be circular so as to reduce the occupation area of the positioning trace on the peripheral area, so that the usable area of the main area is not affected. Therefore, compared with the prior art, the carrier structure of the present disclosure can improve the layout utilization by increasing the number of the packaging substrates as required under the requirement of minimization of the positioning trace.

DETAILED DESCRIPTIONS

Figure 1:
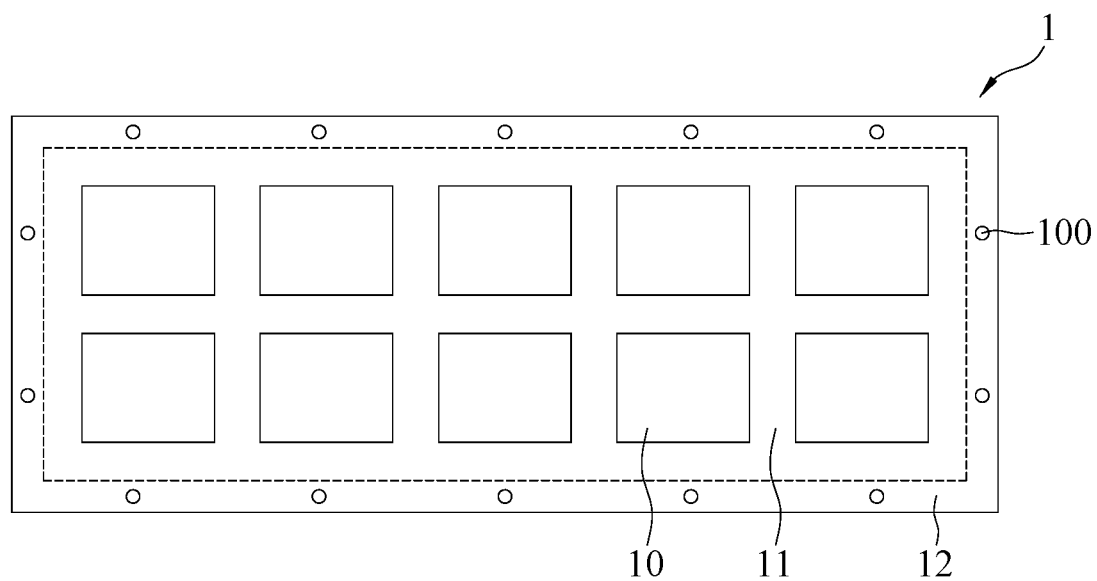
FIG. 1 is a schematic top plan view of a conventional substrate strip.

Implementations of the present disclosure are illustrated using the following embodiments. One of ordinary skill in the art can readily appreciate other advantages and technical effects of the present disclosure upon reading the content of this specification.

It should be noted that the structures, ratios, sizes, etc. shown in the drawings appended to this specification are to be construed in conjunction with the disclosure of this specification in order to facilitate understanding of those skilled in the art. They are not meant to limit the implementations of the present disclosure, and therefore have no substantial technical meaning. Any modifications of the structures, changes of the ratio relationships, or adjustments of the sizes, are to be construed as falling within the range covered by the technical content disclosed herein to the extent of not causing changes in the technical effects created and the objectives achieved by the present disclosure. Meanwhile, terms such as "on," "one," "a," "an," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

Figure 2A:
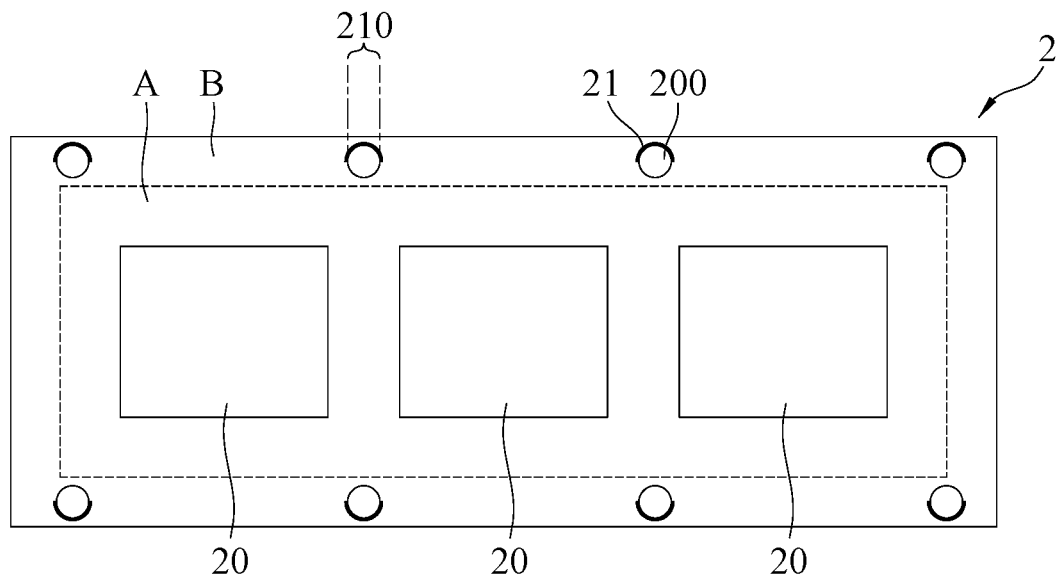
FIG. 2A is a schematic top plan view of a carrier structure of the present disclosure.

FIG. 2A is a schematic top plan view of a carrier structure 2 of the present disclosure. As shown in FIG. 2A, the carrier structure 2 is defined with a main area A and a peripheral area B adjacent to each other (the junction between the main area A and the peripheral area B is shown as dotted line in FIG. 2A), and the carrier structure 2 comprises: a plurality of packaging substrates 20 arranged/located in the main area A, a plurality of positioning holes 200 arranged in the peripheral area B, and a plurality of positioning traces (e.g., positioning trace lines) 21 arranged in the peripheral area B.

In an embodiment, the carrier structure 2 is of a full-panel format, such as a substrate strip format, so as to arrange the plurality of packaging substrates 20 in an array manner.

The packaging substrate 20 is a circuit structure with a core layer or a coreless circuit structure, and the packaging substrate 20 has at least one dielectric layer and a circuit layer (such as a fan-out type redistribution layer [RDL]) disposed on the dielectric layer.

In an embodiment, the main material for forming the dielectric layer is a dielectric material such as polybenzoxazole (PBO), polyimide (PI), prepreg (PP), or the like. It should be understood that the packaging substrate 20 can also be other carriers for carrying chips, such as organic board, semiconductor material, or other carrier boards with metal routing, and the present disclosure is not limited to as such.

Moreover, the main area A is defined with a cutting path between each of the packaging substrates 20 for a singulation process, where the configuration of the cutting path can be manufactured based on the process and the configuration of the packaging substrate 20. For instance, the cutting path can be made of the dielectric layer without the formation of a circuit layer.

Furthermore, the peripheral area B is connected to the main area A to be removed together in the subsequent singulation process. In an embodiment, the configuration of the peripheral area B can be manufactured based on the process and the configuration of the packaging substrate 20. For instance, the peripheral area B can be made of the dielectric layer without the formation of a circuit layer.

The positioning hole 200 is used to accommodate/receive the positioning pin on the machine, such that the positioning pin is in contact with the positioning trace 21 for grounding and antistatic.

In an embodiment, the positioning holes 200 are circular, and the positioning holes 200 are formed in the peripheral area B and corresponding to the corners of the packaging substrate 20. It should be understood that there are various kinds of shapes and layout positions of the positioning holes 200, which can be designed according to requirements without particular limitation.

Besides, the positioning holes 200 can also be served as alignment mechanism in the subsequent process. For example, when disposing an electronic element (not shown) on the packaging substrate 20, the electronic element can be aligned by the plurality of positioning holes 200; alternatively, when performing lamination process or molding process, the upper mold and the lower mold can be precisely arranged on the carrier structure 2 by the plurality of positioning holes 200 to facilitate the formation of an encapsulation layer (not shown) covering the electronic element.

Furthermore, the electronic elements are arranged on the packaging substrates 20 according to the required quantity, and the electronic element can be an active element, a passive element, or a combination of the active element and the passive element, etc., wherein the active element is for example a semiconductor chip, and the passive element is for example a resistor, a capacitor, or an inductor. For instance, the electronic element is a semiconductor chip, and the electronic element can be electrically connected to the packaging substrate 20 by a wire-bonding method; alternatively, the electronic element can be disposed on the packaging substrate 20 by a flip-chip method; or the electronic element can be embedded in the packaging substrate 20. It should be understood that there are various means for the electronic element to be arranged on and electrically connected to the packaging substrate 20, and the present disclosure is not limited to as such.

In addition, the encapsulation layer is an insulating material, such as polyimide (PI), dry film, epoxy resin, or molding compound, and the present disclosure is not limited to as such.

The positioning trace 21 is such as a conductive trace made of metal material, wherein the positioning trace 21 is only arranged along a part of the edge of the positioning hole 200 and is free from surrounding the entire edge of the positioning hole 200, thereby forming a notch 210.

In an embodiment, the notch 210 of the positioning trace 21 is facing toward the main area A, so that the positioning trace 21 is arranged on the edge of the positioning hole 200 away from the side of the main area A.

Figure 2B:
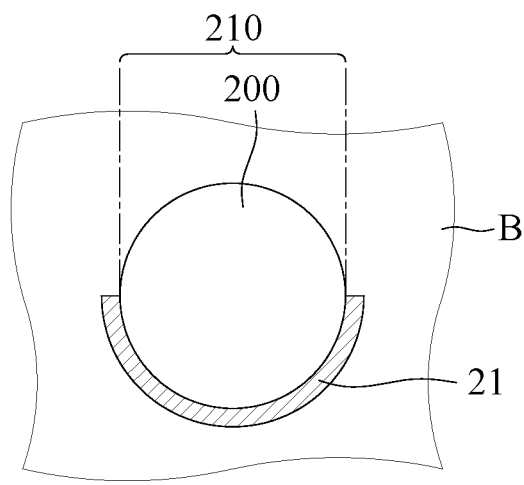
FIG. 2B is a schematic partial enlarged top plan view of FIG. 2A.
Figure 3A:
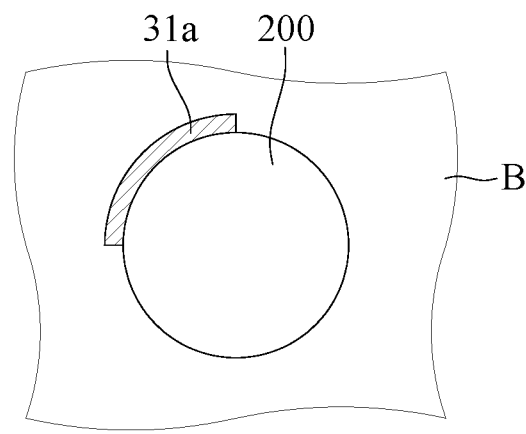
FIG. 3A and FIG. 3B are schematic top plan views showing different aspects of FIG. 2B.
Figure 3B:
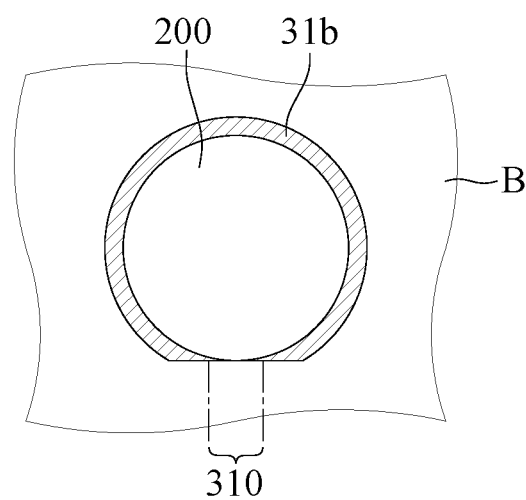

In addition, as shown in FIG. 2B, the positioning trace 21 surrounds the semicircular edge of the positioning hole 200 and presents a semicircular arc. Alternatively, as shown in FIG. 3A, a positioning trace 31a surrounds a quarter of the circular edge (e.g., a quarter-circular edge) of the positioning hole 200 and presents a quarter-circular arc to enlarge the notch. Even, as shown in FIG. 3B, a positioning trace 31b can surround most of the edge of the positioning hole 200 and not be arranged at the top of the arc of the positioning hole 200 (or the tangent of the positioning hole 200), thereby forming a notch 310, so that the positioning trace 31b can have the largest distribution area without affecting the layout utilization of the packaging substrate 20.

Figure 4A:
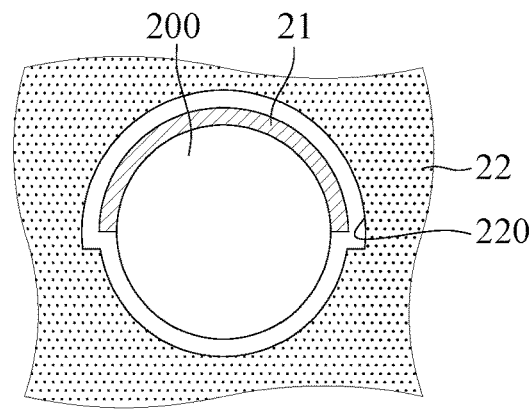
FIG. 4A, FIG. 4B and FIG. 4C are schematic partial top plan views of the carrier structure according to different embodiments of the present disclosure.

Please refer to FIG. 4A, the carrier structure 2 can meet the requirements of the packaging substrate 20 to form an insulating protective layer 22 made of solder mask to cover the peripheral area B and the main area A, and the insulating protective layer 22 is formed with a plurality of openings 220, such that the positioning hole 200 and the positioning trace 21 are exposed from the opening 220. For instance, when the positioning hole 200 is circular, the shape of the opening 220 is corresponding to the contour shape formed by the positioning hole 200 and the positioning trace 21 on the edge of the positioning hole 200, such that the radius of the opening 220 corresponding to the place where the positioning trace 21 is presented is greater than the radius of the opening 220 corresponding to the place where the positioning trace 21 is absent.

Figure 4B:
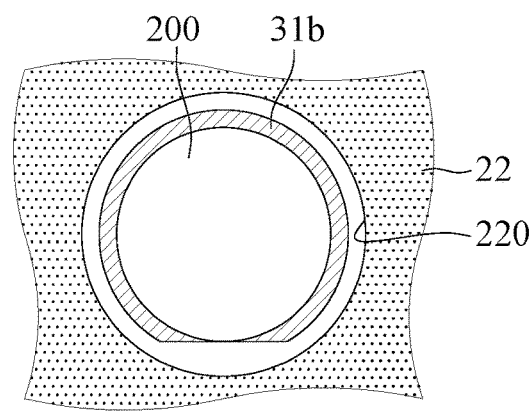
Figure 4C:
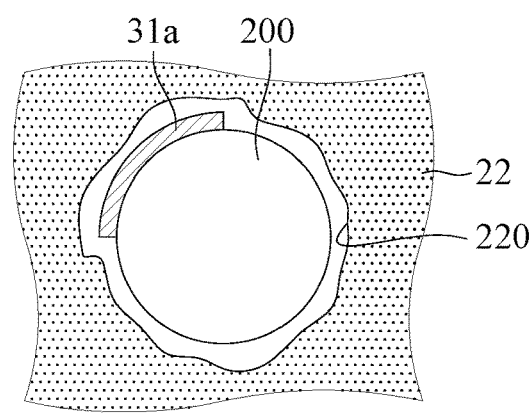

Furthermore, the insulating protective layer 22 can be formed with openings 220 of various shapes according to the requirements, such as the circular shape shown in FIG. 4B, and the opening 220 does not need to correspond to the contour shape formed by the positioning hole 200 and the positioning trace 21. Therefore, the shape of the opening 220 can also be asymmetrical, as shown in FIG. 4C.

Hence, in the carrier structure 2 of the present disclosure, the metal positioning trace 21 is arranged on the edge of the positioning hole 200 to facilitate the positioning pin on the machine to align and connect with the tiny positioning hole 200. Therefore, compared with the prior art, the carrier structure 2 of the present disclosure can prevent the package from being damaged and can improve the layout utilization of the packaging substrate 20.

In addition, the positioning trace 21 is designed with the notch 210, so there is no need for the positioning trace 21 to be circular so as to reduce the occupation area of the positioning trace 21 on the peripheral area B, and the positioning trace 21 is arranged on the edge of the positioning hole 200 away from the side of the main area A, so that the usable area of the main area A is not affected. Hence, compared with the prior art, the carrier structure 2 of the present disclosure can improve the layout utilization by increasing the number of the packaging substrates 20 as required under the requirement of minimization of the positioning traces 21.

To sum up, the carrier structure of the present disclosure meets the requirements of being light, thin and short, and the design of the positioning traces can be beneficial to the protection of the semiconductor elements and the improvement of the layout utilization on the machine during the semiconductor packaging process, thereby significantly improving the yield and output of the semiconductor packaging process.

The above embodiments are set forth to illustrate the principles of the present disclosure and the effects thereof, and should not be interpreted as to limit the present disclosure. The above embodiments can be modified by one of ordinary skill in the art without departing from the scope of the present disclosure as defined in the appended claims. Therefore, the scope of protection of the right of the present disclosure should be listed as the following appended claims.

What is claimed is:

1. A carrier structure being defined with a main area and a peripheral area adjacent to the main area, the carrier structure comprising:
    a plurality of packaging substrates disposed in the main area;
    a plurality of positioning holes disposed in the peripheral area; and
    a plurality of positioning traces disposed in the peripheral area and arranged along a part of edges of the plurality of positioning holes.

2. The carrier structure of claim 1, wherein the plurality of positioning traces are free from surrounding entire edges of the plurality of positioning holes to form notches.

3. The carrier structure of claim 2, wherein the notches of the plurality of positioning traces are facing toward the main area.

4. The carrier structure of claim 1, wherein the plurality of positioning traces are arranged on the edges of the plurality of positioning holes away from sides of the main area.

5. The carrier structure of claim 1, wherein the plurality of positioning holes are circular, and the plurality of positioning traces surround semicircular edges of the plurality of positioning holes and present semicircular arcs.

6. The carrier structure of claim 1, wherein the plurality of positioning holes are circular, and the plurality of positioning traces surround quarter-circular edges of the plurality of positioning holes and present quarter-circular arcs.

7. The carrier structure of claim 1, wherein the plurality of positioning holes are circular, and the plurality of positioning traces surround most of the edges of the plurality of positioning holes and not arranged at top of arcs of the positioning holes.

8. The carrier structure of claim 1, further comprising an insulating protective layer covering the peripheral area and the main area, wherein the insulating protective layer is formed with a plurality of openings, and the plurality of positioning holes and the plurality of positioning traces are exposed from the plurality of openings.

9. The carrier structure of claim 8, wherein shapes of the plurality of openings are corresponding to contour shapes formed by the plurality of positioning holes and the plurality of positioning traces on the edges of the positioning holes.

10. The carrier structure of claim 8, wherein shapes of the plurality of openings are symmetrical.

11. The carrier structure of claim 8, wherein shapes of the plurality of openings are asymmetrical.

* * * * *